United States Patent
Song et al.

(10) Patent No.: US 8,748,917 B2
(45) Date of Patent: Jun. 10, 2014

(54) LIGHT EMITTING DEVICE AND METHOD THEREOF

(75) Inventors: June O Song, Seoul (KR); Young Kyu Jeong, Seoul (KR); Kyung Wook Park, Seoul (KR); Kwang Ki Choi, Seoul (KR); Da Jeong Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 336 days.

(21) Appl. No.: 13/036,394

(22) Filed: Feb. 28, 2011

(65) Prior Publication Data

US 2011/0215350 A1 Sep. 8, 2011

(30) Foreign Application Priority Data

Mar. 8, 2010 (KR) .................. 10-2010-0020485

(51) Int. Cl.
*H01L 29/207* (2006.01)
*H01L 33/00* (2010.01)

(52) U.S. Cl.
USPC ..................................... 257/93; 257/E33.005

(58) Field of Classification Search
USPC .......................................................... 257/93
See application file for complete search history.

(56) References Cited

U.S. PATENT DOCUMENTS

| | | | | |
|---|---|---|---|---|
| 4,928,122 A | * | 5/1990 | Doi et al. ....................... | 347/241 |
| 6,054,716 A | * | 4/2000 | Sonobe et al. ................. | 250/552 |
| 6,444,998 B1 | * | 9/2002 | Taniguchi et al. ............. | 257/13 |
| 6,711,192 B1 | | 3/2004 | Chikuma et al. ............... | 327/43 |
| 6,949,773 B2 | * | 9/2005 | Shin ................................ | 257/99 |
| 8,004,006 B2 | | 8/2011 | Nakahara et al. ............... | 257/99 |
| 8,063,410 B2 | * | 11/2011 | Fudeta ............................ | 257/98 |
| 8,158,490 B2 | | 4/2012 | Umemura et al. .............. | 438/458 |
| 8,274,094 B2 | | 9/2012 | Lee ................................. | 257/98 |
| 8,445,924 B2 | * | 5/2013 | Jeong et al. ..................... | 257/88 |
| 2004/0137655 A1 | | 7/2004 | Chikuma et al. ............... | 438/22 |
| 2006/0261361 A1 | * | 11/2006 | Shakuda ......................... | 257/98 |
| 2007/0284598 A1 | * | 12/2007 | Shakuda et al. ................ | 257/93 |
| 2009/0102369 A1 | * | 4/2009 | Nakanishi et al. ............. | 313/504 |
| 2009/0140647 A1 | * | 6/2009 | Chung et al. ................... | 313/504 |

(Continued)

FOREIGN PATENT DOCUMENTS

CN 1564331 A 1/2005
CN 101084583 A 12/2007

(Continued)

OTHER PUBLICATIONS

Korean Office Action dated Dec. 9, 2010 issued in Application No. 10-2010-0020485.

(Continued)

*Primary Examiner* — Matthew Landau
*Assistant Examiner* — Igwe U Anya
(74) *Attorney, Agent, or Firm* — Ked & Associates, LLP

(57) ABSTRACT

Disclosed are a method of fabricating a light emitting device includes the steps of: forming a plurality of compound semiconductor layers on a substrate, the substrate including a plurality of chip regions and isolation region; selectively etching the compound semiconductor layers to form a light emitting structure on each chip region and form a buffer structure on the isolation region; forming a conductive support member on the light emitting structure and the buffer structure; removing the substrate by using a laser lift off process; and dividing the conductive support member into the a plurality of chips of the chip regions, wherein the buffer structure is spaced apart from the light emitting structure.

20 Claims, 13 Drawing Sheets

(56) References Cited

U.S. PATENT DOCUMENTS

| | | | |
|---|---|---|---|
| 2011/0024784 A1 | 2/2011 | Song | 257/98 |
| 2011/0140076 A1* | 6/2011 | Song | 257/13 |
| 2011/0198621 A1* | 8/2011 | Choi et al. | 257/88 |
| 2011/0242797 A1* | 10/2011 | Park et al. | 362/97.3 |

FOREIGN PATENT DOCUMENTS

| | | |
|---|---|---|
| CN | 101305478 A | 11/2008 |
| JP | 09-148625 A | 6/1997 |
| JP | 2000-323797 A | 11/2000 |
| JP | 2003-303994 A | 10/2003 |
| JP | 2006-019400 A | 1/2006 |
| JP | 2007-067184 | 3/2007 |
| JP | 2007-157926 A | 6/2007 |
| JP | 2010-238922 A | 10/2012 |
| KR | 10-2007-0100852 A | 10/2007 |
| KR | 10-2009-0105462 | 10/2009 |
| KR | 10-2009-0106301 A | 10/2009 |
| KR | 10-2009-0125677 A | 12/2009 |
| WO | WO 2009/145502 A2 | 12/2009 |
| WO | WO 2009145483 A2 * | 12/2009 |

OTHER PUBLICATIONS

Japanese Office Action dated Jul. 17, 2012 issued in Application No. 2011-049897.

Taiwanese Office Action issued in Application No. 10220948860 dated Jul. 19, 2013.

Chinese Office Action dated Dec. 28, 2012 issued in Application No. 201110058560.9.

Chinese Office Action issued in related Application No. 201110058560.9 dated Mar. 10, 2014.

* cited by examiner ically drawn for the
LIGHT EMITTING DEVICE AND METHOD THEREOF The present application claims priority of Korean Patent Application No. 10-2010-0020485 filed on Mar. 8, 2010, which is hereby incorporated by reference in its entirety.

BACKGROUND

The embodiment relates to a light emitting device and a light emitting device package.

Light emitting diodes (LEDs) are a kind of semiconductor devices that convert electric energy into light. The LED is advantageous as compared with conventional light sources, such as a fluorescent lamp or a glow lamp, in terms of power consumption, life span, response speed, safety and environmental-friendly requirement. In this regard, various studies have been performed to replace the conventional light sources with the LEDs. The LEDs are increasingly used as light sources for lighting devices such as various lamps, liquid crystal displays, electric signboards, and street lamps.

SUMMARY

The embodiment provides a light emitting device and a light emitting device package capable of improving reliability.

The embodiment provides a light emitting device and a light emitting device package capable of preventing damages, such as cracks, of the light emitting structure.

The embodiment provides a light emitting device and a light emitting device package capable of improving light emission efficiency.

According to the embodiment, a light emitting device includes: a conductive support member; a plurality of chip regions defining light emitting structures on the conductive support member; an isolation region between the chip regions on the conductive support member; and at least one buffer structure at the isolation region, wherein the light emitting structure and the buffer structure include a first conductive semiconductor layer, an active layer, and a second conductive semiconductor layer.

According to the embodiment, a light emitting device includes: a conductive support member; a plurality of chip regions defining light emitting structures on the conductive support member; an isolation region between the chip regions on the conductive support member; and at least one buffer structure at the isolation region, wherein the light emitting structure and the buffer structure include a first conductive semiconductor layer, an active layer, and a second conductive semiconductor layer, and wherein the buffer structure includes a zener device.

According to the embodiment, a light emitting device package includes: a body; first and second electrodes on the body; a light emitting device electrically connected to the first and second lead electrodes on the body; and a molding member surrounding the light emitting device on the body, wherein the light emitting device includes: a conductive support member; a plurality of chip regions defining light emitting structures on the conductive support member; an isolation region between the chip regions on the conductive support member; and at least one buffer structure at the isolation region, and wherein the light emitting structure and the buffer structure include a first conductive semiconductor layer, an active layer, and a second conductive semiconductor layer.

DETAILED DESCRIPTION OF THE EMBODIMENTS

Figure 1:
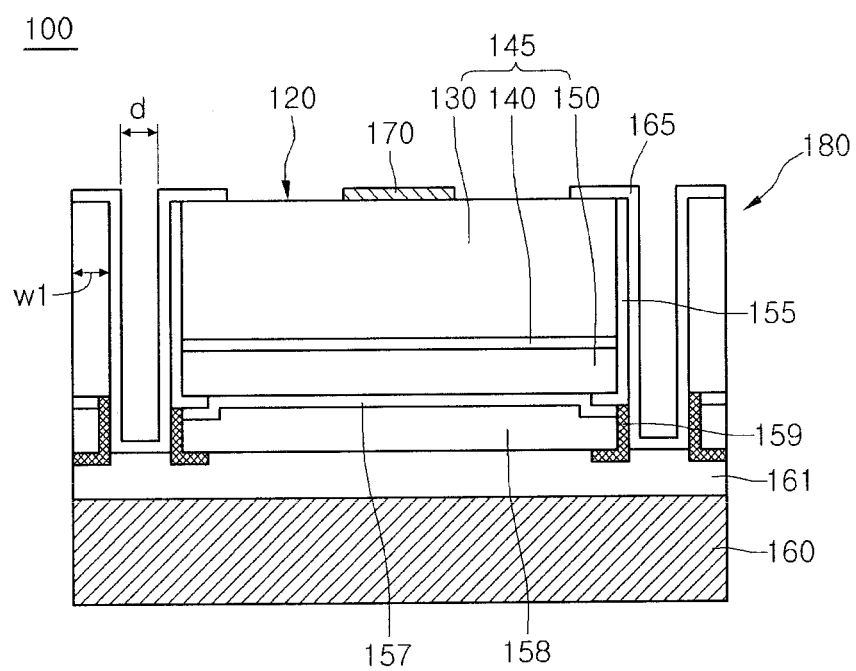
FIG. 1 is a sectional view showing a light emitting device according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Figure 2A:
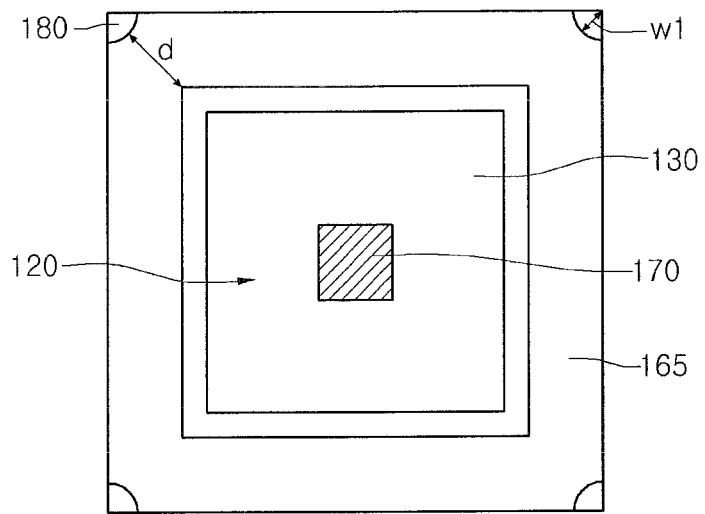
FIGS. 2A to 2C are plan views showing the light emitting device of FIG. 1.
Figure 2B:
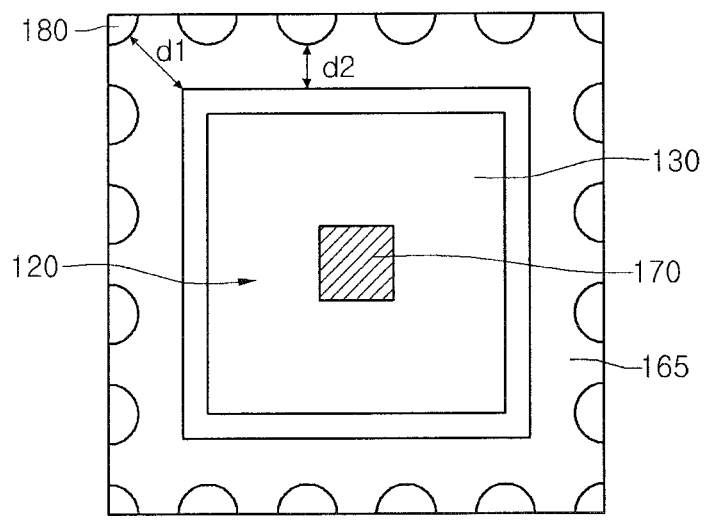
Figure 2C:
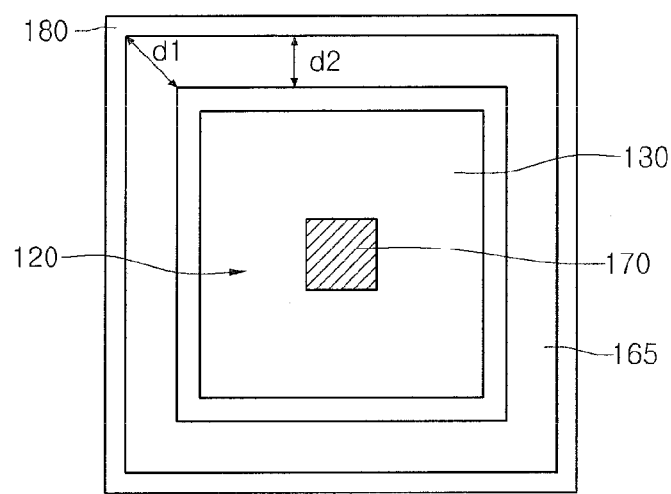

FIG. 1 is a sectional view showing a light emitting device 100 according to a first embodiment, and FIGS. 2A to 2C are plan views showing the light emitting device 100 of FIG. 1.

Referring to FIGS. 1 and 2, the light emitting device 100 according to the first embodiment includes a conductive support member 160, a light emitting structure 120 formed on the conductive support member 160 to generate light, and at least one buffer structure 180 formed on the conductive support member 160 such that the buffer structure 180 is spaced apart from the light emitting structure 120 at a predetermined distance d, and prevents the light emitting device 120 from being damaged in the manufacturing process of the light emitting device 100.

The light emitting structure 120 includes a first adhesive layer 158, a reflective layer 157 on the first adhesive layer 158, a diffusion barrier layer 159 at lateral surfaces of the first adhesive layer 158 and the reflective layer 157, a plurality of compound semiconductor layers 145 formed on the reflective layer 157 to emit light, and an electrode 170 formed on the compound semiconductor layers 145 to supply power to the light emitting structure 120 together with the conductive support member 160. The electrode 170 may include at least one electrode pad. In addition, the electrode 170 may have an arm electrode structure. The buffer structure 180 and the light emitting structure 120 may nave a stack structure of the same layers or the same height.

At least one buffer structure 180 may be spaced apart from the lateral surfaces of the light emitting structure 120 at a predetermined distance d.

For example, the distance d may be in the range of about 5 µm to about 50 µm. In addition, a width of the buffer structure 180 may be the range of about 5 µm to about 30 µm. However, the distance d and the width w1 may vary according to the design of the light emitting device 100, but the embodiment is not limited thereto.

The buffer structure 180 may not generate light, but absorbs the impact that may occur in the manufacturing process of the light emitting device 100 according to the embodiment, so that the damage of the light emitting structure 120 can be prevented. In other words, the buffer structure 180 is formed, so that the reliability for the light emitting device 100 according to the embodiment and the method of manufacturing the light emitting device 100 can be improved, and the details thereof will be described below.

Hereinafter, the light emitting device 100 according to the embodiment will be described in detail while focusing on the components and the operation of the light emitting device 100.

The conductive support member 160 supports the light emitting structure 120 and the buffer structure 180 while supplying power to the light emitting structure 120 together with the electrode 170.

For example, the conductive support member 160 may include at least one selected from the group consisting of titan (Ti), chromium (Cr), nickel (Ni), aluminum (Al), platinum (Pt), gold (Au), tungsten (W), copper (Cu), molybdenum (Mo) and a carrier wafer (including Si, Ge, GaAs, ZnO, SiC, SiGe, or GaN).

A second adhesive layer 161 may be formed on a top surface of the conductive support member 160. The second adhesive layer 161 may include AuSn, AuIn, or NiSn representing superior adhesive strength to firmly bond the light emitting structure 120 and the buffer structure 180 to the conductive support member 160.

The light emitting structure 120 and the buffer structure 180 may be formed on the conductive support member 160. The buffer structure 180 may be spaced apart from the lateral surfaces of the light emitting structure 120 at the distance d. The buffer structure 180 and the light emitting structure 120 may have a stack structure of the same layers or the same height.

As shown in FIG. 2A, the buffer structure 180 may be spaced apart from edge regions of the light emitting structure 120 at the distance d.

As shown in FIGS. 2B and 2C, a plurality of buffer structures 180 may be provided separately from each other or may be integral with each other while being spaced apart from the edge regions of the light emitting structure 120 and the lateral surfaces of the light emitting structure 120. In other words, the integration means that the buffer structures 180 is not separated from each other, but continuously liked with each other along each lateral surface of the light emitting structure 120.

The distance d may vary according to the positions of the buffer structure 180. In other words, the distance d1 between the buffer structure 180 and the edge regions of the light emitting structure 120 may be greater than a distance d2 between the lateral surfaces of the light emitting structure 120 and the buffer structure 180.

For example, the distance d may be in the range of about 5 µm to about 50 µm. The distance d may be determined according to the width of an isolation region formed to divide a plurality of chips in the unit of an individual chip in the manufacturing process of the light emitting device 100 according to the embodiment, and the details thereof will be described in detail below.

For example, the width w1 of the buffer structure 180 may be in the range of about 5 µm to about 30 µm. The width w1 of the buffer structure 180 may vary according to the design or the manufacturing process of the light emitting device 100, but the embodiment is not limited thereto.

In addition, a top surface of the buffer structure 180 may have a cross shape, a circular shape, a diamond shape, a sector shape, a semicircular shape, a polygonal shape, or a ring shape, but the embodiment is not limited thereto.

The buffer structure 180 may not generate light, but absorbs the impact that may occur in the manufacturing process of the light emitting device 100 according to the embodiment, so that the damage of the light emitting structure 120 can be prevented.

In detail, in place of the light emitting structure 120, the buffer structure 180 absorbs the impact caused by the energy of a laser used in an LLO (Laser Lift Off) process to remove a substrate.

In other words, in a typical LLO process, which does not employ the buffer structure 180, damages such as cracks may occur in the lateral surfaces or the edge regions of the light emitting structure 120 due to the impact caused by the energy of a laser used in the LLO process. In contrast, the light emitting device 100 according to the embodiment includes the buffer structure 180 to absorb the impact caused by the laser energy, thereby preventing damages such as cracks from occurring in the light emitting structure 120.

The light emitting structure 120 and the buffer structure 180 may be simultaneously formed in the same manufacturing process. In this case, at least parts of the stack structures of the above structures may have the same layers as each other.

Hereinafter, the embodiment will be described while focusing on a case in which at least parts of the stack structures of the above structures have the same layers as each other. However, the light emitting structure 120 and the buffer structure 180 may be formed through different manufacturing processes and may include different materials, but the embodiment is not limited thereto.

The light emitting structure 120 and the buffer structure 180 may include the first adhesive layer 158, the reflective layer 157 on the first adhesive layer 158, the diffusion barrier layer 150 on the lateral surfaces of the first adhesive layer 158 and the reflective layer 157, and the compound semiconductor layers 145 on the reflective layer 157.

The first adhesive layer 158 may have the same material as that of the second adhesive layer 161. For example, the first adhesive layer 158 may include AuSn, AuIn, or NiSn representing superior adhesive strength. The first adhesive layer 158 is bonded to the second adhesive layer 161 to firmly bond the light emitting structure 120 and the conductive support member 160 to the buffer structure 180.

The reflective layer 157 is interposed between the compound semiconductor layers 145 and the conductive support member 160 to reflect light generated from the compound semiconductor layers 145 of the light emitting structure 120. Accordingly, the light emission efficiency of the light emitting device 100 can be improved.

For example, the reflective layer 157 may include one of silver (Ag), the alloy thereof, aluminum (Al), and the alloy thereof, but the embodiment is not limited thereto.

When the reflective layer 157 does not make ohmic contact with the compound semiconductor layer 145, an ohmic layer (not shown) may be additionally interposed between the reflective layer 157 and the compound semiconductor layer 145.

The diffusion barrier layer 159 may be formed on the lateral surfaces of the first adhesive layer 158 and the reflective layer 157.

The diffusion barrier layer 159 can prevent the first adhesive layer 158, the reflective layer 157, the second adhesive layer 161, and the conductive support member 160 from being degraded due to inter-diffusion. The diffusion barrier layer 159 may have a single layer structure or a multiple layer structure including at least one selected from the group consisting of Ti, Ni, W and Pt, but the embodiment is not limited thereto.

The compound semiconductor layers 145 may be formed on the reflective layer 157. The compound semiconductor layers 145 may include group III to V compound semiconductors, and may include a semiconductor material having a compositional formula of $In_xAl_yGa_{1-x-y}N$ ($0 \leq x \leq 1$, $0 \leq y \leq 1$, $0 \leq x+y \leq 1$), but the embodiment is not limited thereto.

The electrode 170 may be formed on the top surface of the compound semiconductor layers 145 formed in the light emitting structure 120. Power is supplied by the electrode 170 and the conductive support member 160, so that light can be generated from the compound semiconductor layers 145.

For example, the compound semiconductor layers 145 may include a second conductive semiconductor layer 150, an active layer 140 on the second conductive semiconductor layer 150, and a first semiconductor layer 130 on the active layer 140.

For example, the second conductive semiconductor layer 150 may include a P type semiconductor layer having P type dopants. The p type semiconductor layer may include semiconductor materials having the compositional formula of $In_xAl_yGa_{1-x-y}N$ ($0 \leq x \leq 1$, $0 \leq y \leq 1$, $0 \leq x+y \leq 1$), such as InAlGaN, GaN, AlGaN, InGaN, AlInN, AlN, or InN. In addition, the P type semiconductor layer may be doped with P type dopant such as Mg, Zn, Ca, Sr, or Ba.

The active layer 140 may be formed on the second conductive semiconductor layer 150. Electrons (or holes) injected through the first conductive semiconductor layer 130 may be recombined with holes (or electrons) injected through the second conductive semiconductor layer 150 at the active layer 140, so that the active layer 140 emits the light of the wavelength based on the band gap difference of the energy band according to the intrinsic material of the active layer 140.

The active layer 140 may have a single quantum well structure, a multiple quantum well (MQW) structure, a quantum wire structure or a quantum dot structure, but the embodiment is not limited thereto.

The active layer 140 may include a semiconductor material having a compositional formula of $In_xAl_yGa_{1-x-y}N$ ($0 \leq x \leq 1$, $0 \leq y \leq 1$, $0 \leq x+y \leq 1$). If the active layer 140 has the MQW, the active layer 140 may have the stack structure of a plurality of well layers and a plurality of barrier layers. For example, the active layer 140 may have the stack structure of InGaN well/ GaN barrier layers.

A clad layer (not shown) doped with the N type or P type dopants can be formed on and/or under the active layer 140. The clad layer may include an AlGaN layer or an InAlGaN layer.

The first semiconductor layer 130 may be formed on the active layer 140. The first semiconductor layer 130 includes only a first conductive semiconductor layer, or an undoped semiconductor layer formed on the first conductive semiconductor layer, but the embodiment is not limited thereto.

For instance, the first conductive semiconductor layer may include an N type semiconductor layer including N type dopants. The N type semiconductor layer may include semiconductor materials having the compositional formula of $In_xAl_yGa_{1-x-y}N$ ($0 \leq x \leq 1$, $0 \leq y \leq 1$, $0 \leq x+y \leq 1$), such as InAlGaN, GaN, AlGaN, AlInN, InGaN, AlN, or InN. In addition, the N type semiconductor layer may be doped with N type dopant such as Si, Ge or Sn.

Since the undoped semiconductor layer is not doped with conductive dopants, the undoped semiconductor layer may have remarkably low electrical conductivity as compared with that of the second conductive semiconductor layer 150, and may be formed to improve the crystalline of the first conductive semiconductor layer.

Differently from the previous embodiments, the first conductive layer 130 may include a P type semiconductor layer including P type dopants, and the second conductive semiconductor layer 150 may include an N type semiconductor layer including N type dopants. In addition, a third conductive semiconductor layer (not shown) including N type dopants or P type dopants may be formed on the first semiconductor layer 130. Accordingly, the light emitting device 100 may have at least one of one of an N-P junction structure, a P-N junction structure, an N-P-N junction structure, and a P-N-P junction structure. The doping concentration of conductive dopants of the first conductive semiconductor layer and the second conductive semiconductor layer 150 may be irregular or uniform. In other words, the compound semiconductor layers 145 may have various structures, but the embodiment is not limited thereto.

A first protective layer 155 may be formed at a lateral surface of the compound semiconductor layers 145. The first protective layer 155 may include at least one selected from the group consisting of $Si_xO_y$, $Si_3N_4$, $Si_xN_y$, $SiO_xN_y$, $Al_2O_3$, $TiO_2$ and $MgF_2$. Accordingly, the compound semiconductor layers 145 can be prevented from being electrically shorted with the conductive support member 160.

Meanwhile, as shown in FIG. 1, the first protective layer 155 may be not formed at the lateral surface of the compound semiconductor layers 145 of the buffer structure 180 that does not generate light.

A second protective layer 165 may be formed at the lateral surfaces of the light emitting structure 120 and the buffer structure 180 and on the conductive support member 160. In detail, the second protective layer 165 may be formed on the lateral surface of the first protective layer 155, the lateral surface of the diffusion barrier layer 159, and the top surface of the second adhesive layer 161.

The second protective layer 165 may be formed to prepare for the damage of the first protective layer 155 in the manufacturing process of the light emitting device 100. In other words, the second protective layer 165 can prevent the light emitting structure 120 from being electrically shorted with the conductive support member 160 or the buffer structure 180 due to the crack of the first protective layer 155.

The second protective layer 165 may include material the same as that of the first protective layer 155. For example, the second protective layer 165 may be formed by using at least one selected from the group consisting of $SiO_2$, $Si_xO_y$, $Si_3N_4$, $Si_xN_y$, $SiO_xN_y$, $Al_2O_3$, $TiO_2$, and $MgF_2$ through a deposition scheme, but the embodiment is not limited thereto.

Hereinafter, the manufacturing process of the light emitting device 100 according to the embodiment will be described in detail, and the structures and components the same as those of the previous embodiments will be not further described or will be briefly described.

FIGS. 3 to 10 are views showing the manufacturing process of the light emitting device 100 according to the first embodiment.

Figure 3:
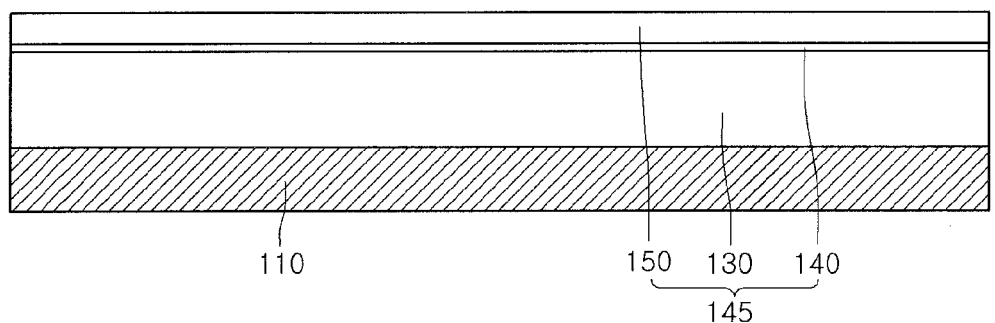
FIGS. 3 to 10 are sectional views showing the manufacturing process of the light emitting device according to the first embodiment.
Figure 4:
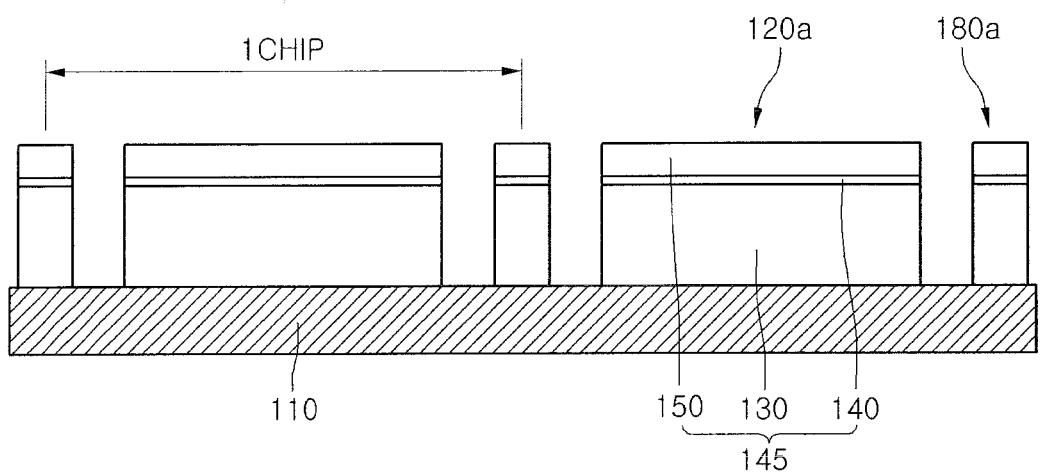

Referring to FIG. 3, the compound semiconductor layers 145 may be grown from a substrate 110. For example, the compound semiconductor layers 145 may include the first semiconductor layer 130, the active layer 140 on the first semiconductor layer 130, and the second conductive semiconductor layer 150 on the active layer 140.

The compound semiconductor layers 145 may be formed using a MOCVD (Metal Organic Chemical Vapor Deposition), CVD (Chemical Vapor Deposition), PECVD (Plasma-Enhanced Chemical Vapor Deposition), MBE (Molecular Beam Epitaxy), or HVPE (Hydride Vapor Phase Epitaxy) scheme, but the embodiment is not limited thereto.

Referring to FIG. 4 and FIGS. 5A to 5C, the compound semiconductor layers 145 is selectively removed, so that a plurality of first structures 120a and a plurality of second structures 180a may be formed. For example, the compound semiconductor layers 145 may be selectively removed through an etching process, but the embodiment is not limited thereto.

The first and second structures 120a and 180a are formed to the light emitting structure 120 and the buffer structure 180, respectively, through the manufacturing process.

The width between the first structures 120a, that is, a width x of an isolation region M to divide a plurality of chip regions which each chip region has one chip, in the unit of an individual chip (1 CHIP), may be in the range of about 5 μm to about 100 μm. The width x of the isolation region M may be defined by the distance between adjacent chips. In addition, the second structures 180a may be formed at the middle portion of the isolation region M, that is, a region corresponding to ½ of the width x of the isolation region M.

Therefore, the light emitting structure 120 and the buffer structure 180, which are formed in the following process, may be spaced apart from each other at the distance d corresponding to about ½ of the width x of the isolation region M.

Figure 5A:
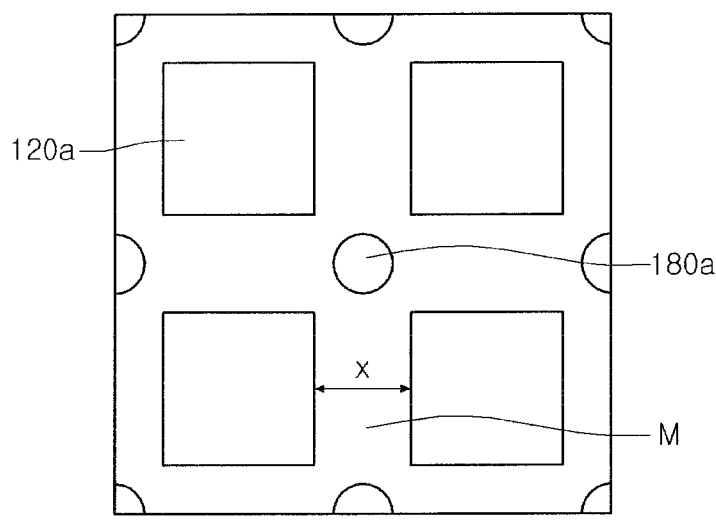
Figure 5B:
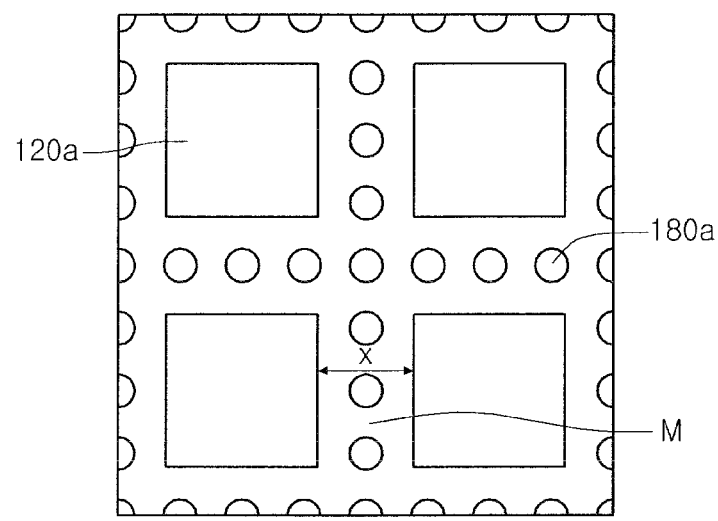
Figure 5C:
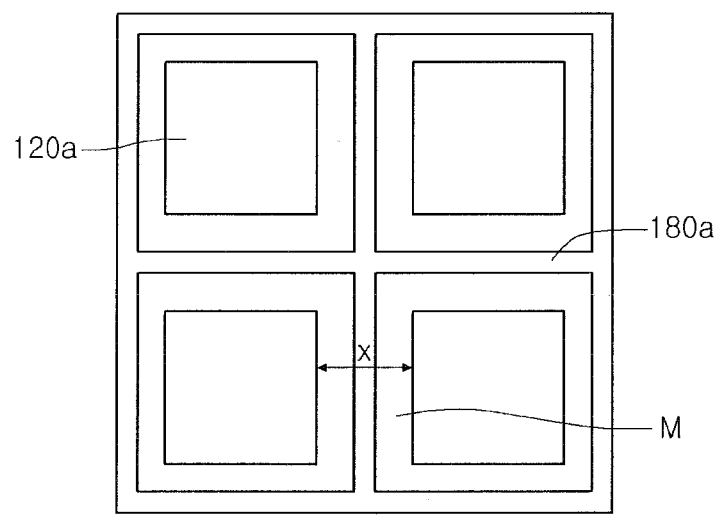

Meanwhile, the top surface of the second structures 180a may have a circular shape or a polygonal shape as shown in FIGS. 5A and 5B, or may have a lattice shape formed along the lateral surface of the first structures 120a as shown in FIG. 5c. However, according to the embodiment, the shape of the second structures 180a IS not limited thereto.

Figure 6:
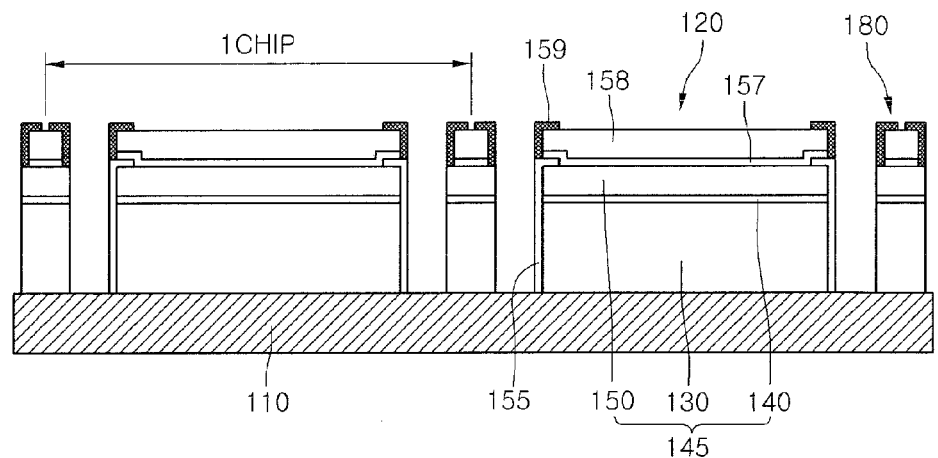

Referring to FIG. 6, the reflective layer 157, the first adhesive layer 158, and the diffusion barrier layer 159 are formed on the first structures 120a and the second structures 180a, so that the light emitting structure 120 and the buffer structure 180 according to the embodiment can be provided.

Before the reflective layer 157 is formed, the first protective layer 155 may be additionally formed on the lateral surface of the light emitting structure 120 and the buffer structure 180.

Figure 7:
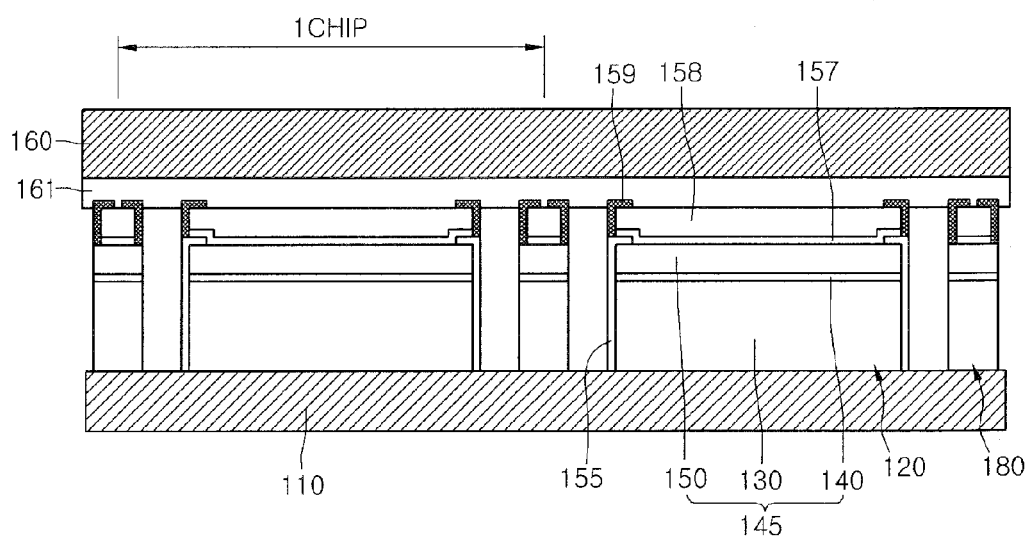

Referring to FIG. 7, the conductive support member 160 may be formed on the light emitting structure 120 and the buffer structure 180.

For example, the conductive support member 160 may be prepared in the form of a sheet plate and bonded onto the light emitting structure 120 and the buffer structure 180.

In this case, the second adhesive layer 161 may be formed on the bottom surface of the conductive support member 160. The second adhesive layer 161 may be bonded to the first adhesive layer 158 on the top surface of the light emitting structure 120 and the buffer structure 180.

Figure 8:
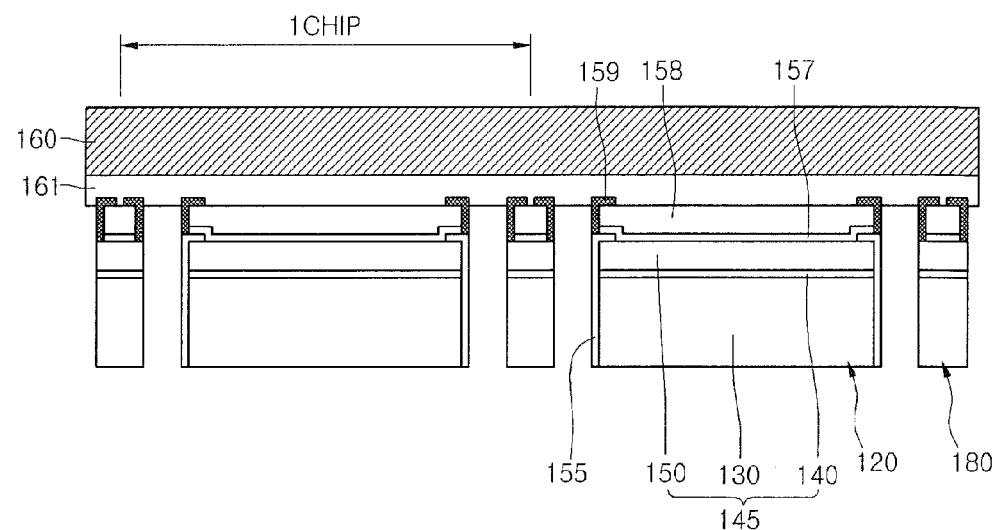

Referring to FIG. 8, the substrate 110 may be removed through an LLO (Laser Lift Off) process.

The LLO process is to separate the compound semiconductor layers 145 from the substrate 110 by laser energy applied to the bottom surface of the substrate 110.

According to the conventional LLO process, damages such as cracks may occur at the lateral surface or the edge of the light emitting structure due to the impact caused by the laser energy.

However, in the light emitting device 100 according to the embodiment, since the buffer structure 180 is formed to absorb the impact caused by the laser energy, the impact to be applied to the lateral surfaces and the edge regions of the light emitting structure 120 is absorbed by the buffer structure 180, thereby preventing damages such as cracks from occurring in the light emitting structure 120.

Since the buffer structure 180 absorbs laser energy, the buffer structure 180 can prevent damages such as cracks.

Figure 9:
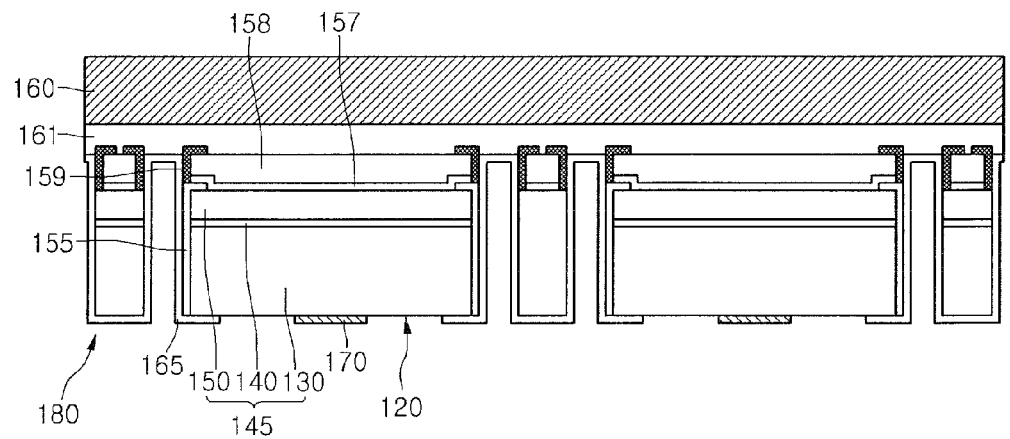

Referring to FIG. 9, the second protective layer 165 may be formed on the lateral surfaces of the light emitting structure 120 and the buffer structure 180 and on the conductive support member 160.

For example, the second protective layer 165 may be formed using a deposition process along a surface exposed when the substrate 110 is removed.

The second protective layer 165 may complement the first protective layer 155 that may be damaged in the LLO process.

The electrode 170 may be formed on the bottom surface of the light emitting structure 120. The electrode 170 may have a single layer structure or a multiple layer structure including at least one selected from the group consisting of aluminum (Al), titanium (Ti), chrome (Cr), nickel (Ni), copper (Cu), and gold (Au).

Figure 10:
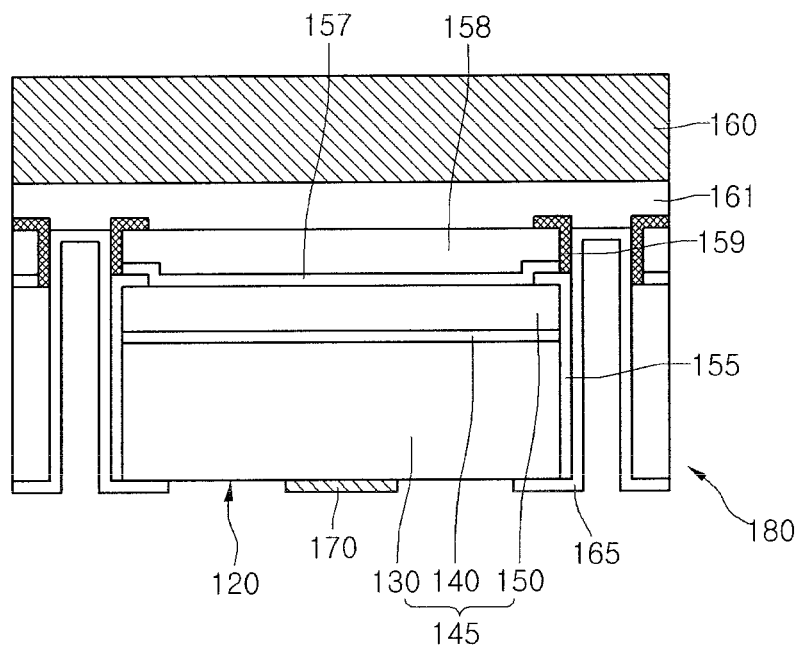

Referring to FIG. 10, the chip separation process is performed to divide the chips in the unit of an individual chip (1 chip), so that the light emitting device 100 according to the embodiment can be provided.

The chip separate process may include at least one of a breaking process using a cutter, an etching process including a dry etching process or a wet etching process, and a laser scribing process using a laser, but the embodiment is not limited thereto.

The buffer structure 180 may be separated or removed along the chip boundary through the chip separation process.

Figure 11:
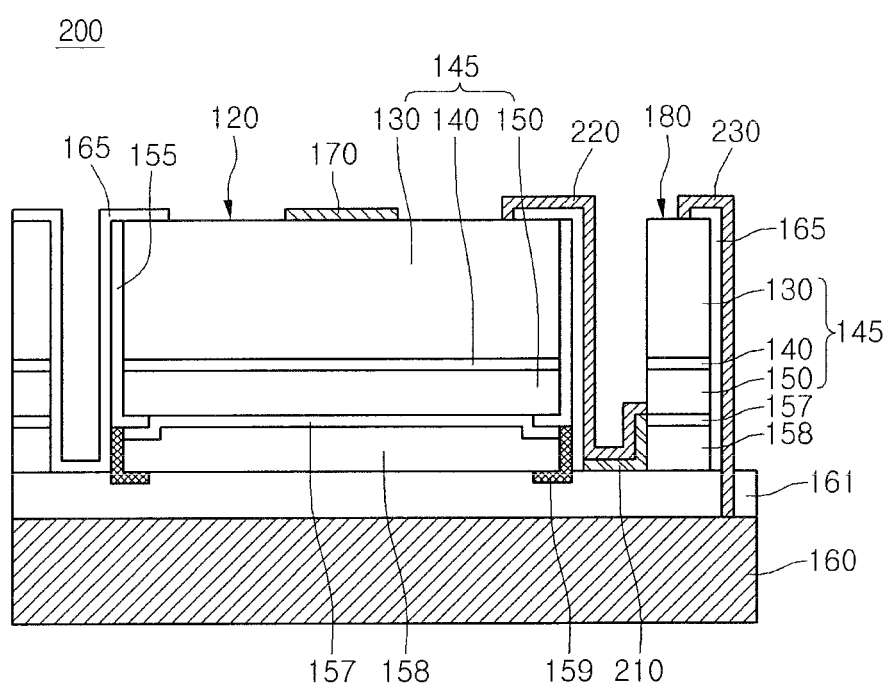
FIG. 11 is a sectional view showing a light emitting device according to a second embodiment.

FIG. 11 is a sectional view showing a light emitting device according to the second embodiment.

The second embodiment has the same structure as that of the first embodiment except that the buffer structure 180 according to the second embodiment includes a zener device. Accordingly, in the second embodiment, the same reference numbers will be assigned to those of the first embodiment, and the details thereof will be omitted.

Referring to FIG. 11, the light emitting device 200 according to the second to the embodiment includes the conductive support member 160, the light emitting structure 120 formed on the conductive support member 160 to generate light, and at least one buffer structure 180 spaced apart from the light emitting structure 120 at the distance d on the conductive support member 160 to prevent the light emitting structure 120 from being damaged in the manufacturing process of the light emitting device 200.

The light emitting structure 120 may include the first adhesive layer 158, the reflective layer 157 on the first adhesive layer 158, the diffusion barrier layer 150 on the lateral surfaces of the first adhesive layer 158 and the reflective layer 157, the compound semiconductor layers 145 on the reflective layer 157 to emit light, and the electrode 170 formed on the compound semiconductor layers 145 to supply power to the light emitting structure 120 together with the conductive support member 160.

The buffer structure 180 and the light emitting structure 120 may have a stack structure of the same layers or may have the same height.

For example, the buffer structure 180 may include the first adhesive layer 158 and the compound semiconductor layers 145.

At least one buffer structure 180 may be spaced apart from the lateral surface of the light emitting structure 120 at the distance d.

The buffer structure 180 may not generate light. Instead, the buffer structure 180 absorbs the impact that may occur in the manufacturing process of the light emitting device 100 according to the embodiment to prevent the light emitting structure 120 from being damaged. In other words, the buffer structure 180 is formed, so that the reliability of the light emitting device 200 according to the embodiment and the method of manufacturing the same can be improved.

The conductive support member 160 supports the light emitting structure 120 and the buffer structure 180 while supplying power to the light emitting structure 120 together with the electrode 170.

The light emitting structure 120 and the buffer structure 180 may be simultaneously formed in the same manufacturing process. In this case, at least parts of the stack structures of the above structures 1210 and 180 may be the same layers as each other.

The second protective layer 165 may be formed on the lateral surfaces of the light emitting structure 120 and the buffer structure 180 and on the conductive support member 160. In detail, the second protective layer 165 may be formed on the lateral surfaces of the first protective layer 155 and the diffusion barrier layer and on the second adhesive layer 161.

An insulating layer 210 may be formed on the second adhesive layer 161 between the light emitting structure 120 and the buffer structure 180, or on the conductive support member 160. The insulating layer 210 may be formed on the lateral surfaces of the second protective layer 165 of the light emitting structure 120, a top surface of the second adhesive layer 161 or the conductive support member 160, and lateral surfaces of the first adhesive layer 158 and the reflective layer 157 of the buffer structure 180.

The insulating layer 210 may include at least one selected from the group consisting of $SiO_2$, $Si_xO_y$, $Si_3N_4$, $Si_xN_y$, $SiO_xN_y$, $Al_2O_3$, $TiO_2$ and $MgF_2$.

The buffer structure 180 may include a zener device. To this end, the first and second zener electrodes 220 and 230 may be electrically connected to the buffer structure 180.

The first zener electrode 220 may be electrically connected to the second conductive semiconductor layer 150 of the buffer structure 180. The first zener electrode 220 may make contact with the lateral surface of the second conductive semiconductor layer 150 of the buffer structure 180. The first zener electrode 220 connected to the second conductive semiconductor layer 150 may be electrically connected to the first conductive semiconductor layer 130 of the light emitting structure 120.

The first zener electrode 220 may be formed on the second protective layer 165 and the insulating layer 210 between the first conductive semiconductor layer 130 of the light emitting structure 120 and the second conductive semiconductor layer 150 of the buffer structure 180.

The insulating layer 210 may have the same material as that of the second protective layer 165, but the embodiment is not limited thereto.

The second zener electrode 230 may be electrically connected to the first conductive semiconductor layer 130 of the buffer structure 180.

The second zener electrode 230 may be electrically connected to the first conductive semiconductor layer 130 of the buffer structure 180 and the conductive support member 160.

The second zener electrode 230 is formed on the second protective layer 165, and may be electrically connected to the conductive support member 160 through the second adhesive layer 161.

The second protective layer 165 can prevent the first conductive semiconductor layer 130 from being electrically shorted with the second conductive semiconductor layer 150 by the second zener electrode 230.

The first and second zener electrodes 220 and 230 may include the same material as that of the light emitting structure 120, or may include material different from that of the light emitting structure 120. For example, the first and second zener electrodes 220 and 230 may have a single layer structure or a multiple layer structure including at least one selected from the group consisting of Al, Ti, Cr, Ni, Cu, and Au As described above, since the buffer structure 180 includes a zener device, if great reverse voltage is applied, current flows to the zener device of the buffer structure 180. Accordingly, the current does not flow to the light emitting structure 120, thereby preventing the light emitting structure 120 from being damaged.

Figure 12:
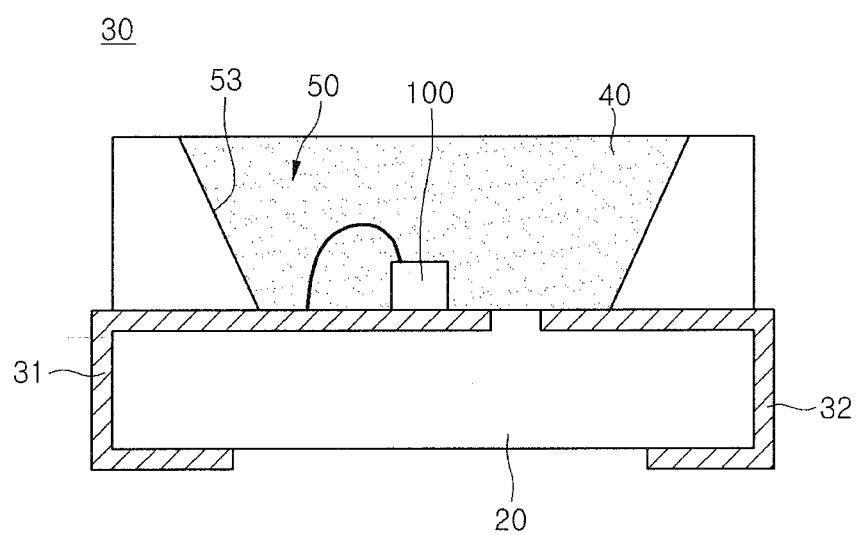
FIG. 12 is a sectional view showing a light emitting device package including a light emitting device according to the embodiment.

FIG. 12 is a light emitting device package 30 including the light emitting device according to the embodiment.

Referring to FIG. 12, the light emitting device package 30 includes a body 20, first and second lead electrodes 31 and 32 installed in the body 20, the light emitting device 100 provided on the body 20 and electrically connected to the first and second lead electrodes 31 and 32, and a molding member 40 that surrounds the light emitting device 100 on the body 20.

The body 20 may include silicon, synthetic resin or metallic material. When viewed from the top, the body 20 has a cavity having an open upper portion and formed with an inclined inner wall.

The first and second electrode layers 31 and 32 are electrically isolated from each other and pass through the body 20.

In detail, one ends of the first and second lead electrodes 31 and 32 are disposed in the cavity 50 and the other ends of the first and second lead electrodes 31 and 32 are attached to an outer surface of the body 20 and exposed to the outside.

The first and second electrode layers 31 and 32 supply power to the light emitting device 100 and improve the light efficiency by reflecting the light emitted from the light emitting device 100. Further, the first and second lead electrodes 31 and 32 dissipate heat generated from the light emitting device 100 to the outside.

The light emitting device 100 can be installed on the body 20 or the first or second lead electrode 31 or 32.

The molding member 40 surrounds the light emitting device 100 to protect the light emitting device 100. In addition, the molding member 40 may include luminescence material to change the wavelength of the light emitted from the light emitting device 100 by the luminescence material.

Figure 13:
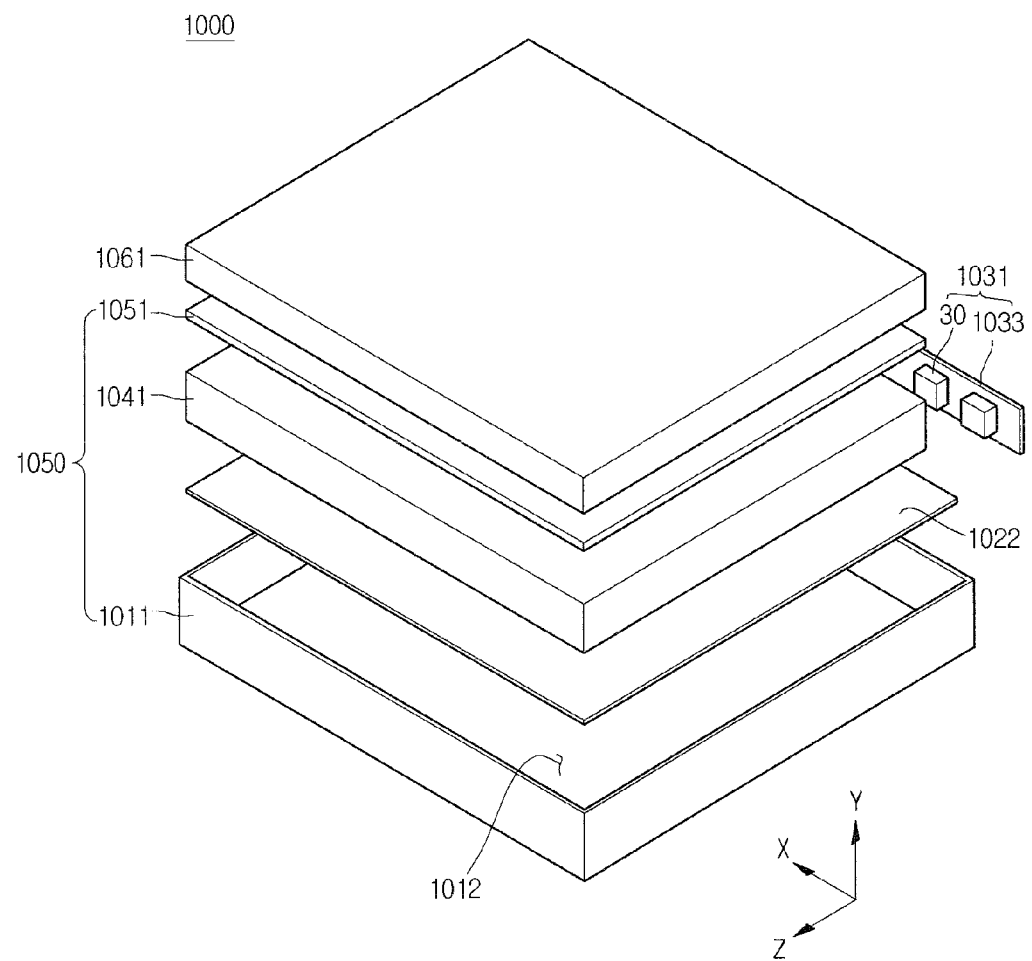
FIG. 13 is an exploded perspective view showing a display apparatus according to the embodiment.
Figure 14:
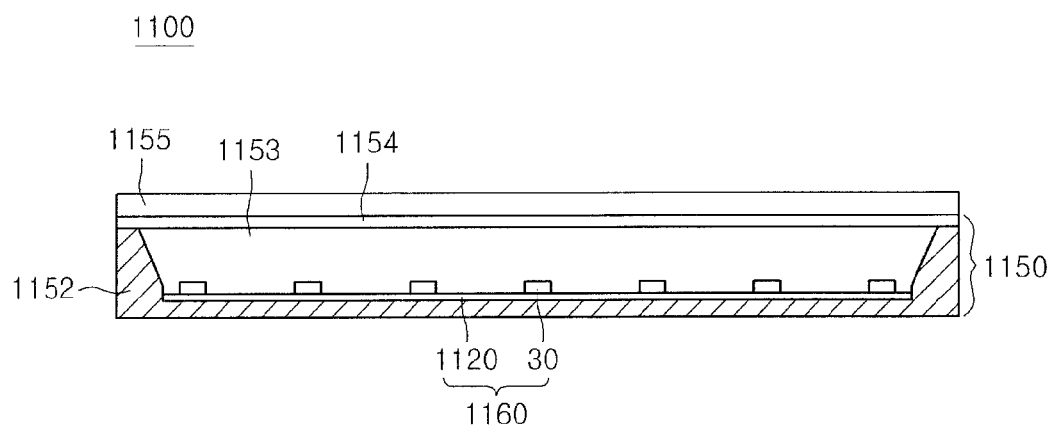
FIG. 14 is a view showing the display apparatus according to the embodiment.
Figure 15:
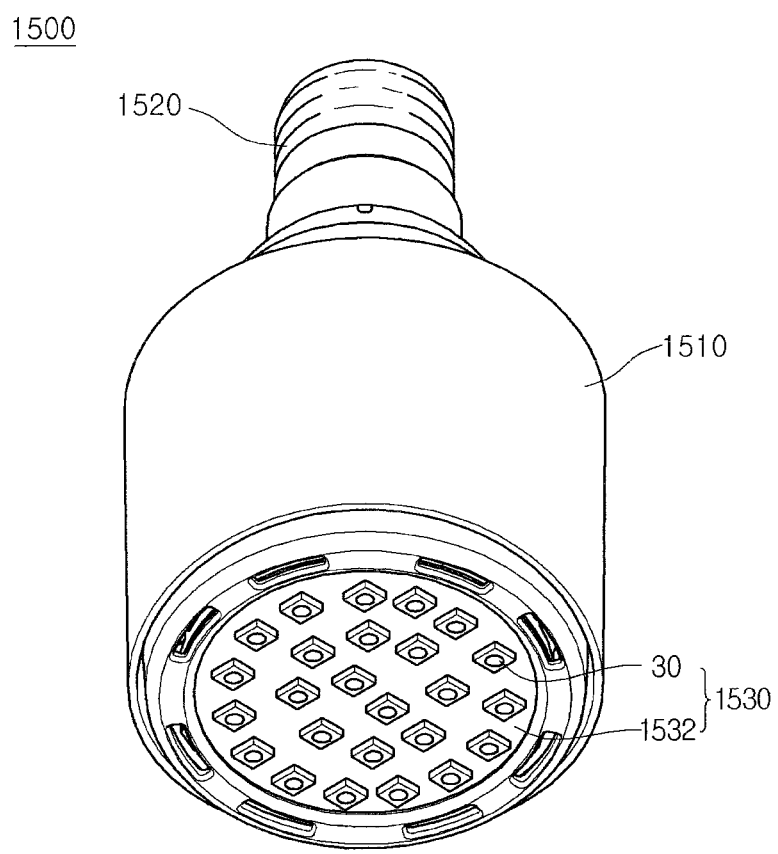
FIG. 15 is a perspective view showing a lighting unit according to the embodiment.

The light emitting device or the light emitting device package according to the embodiment may be applied to the light unit. The light unit has an array structure of a plurality of light emitting devices or a plurality of light emitting device packages. The light unit may include the display device as shown in FIGS. 13 and 14 and the lighting device as shown in FIG. 15. In addition, the light unit may include a lighting lamp, a signal lamp, a headlight of a vehicle, and an electric signboard.

FIG. 13 is an exploded perspective view showing the display device according to the embodiment.

Referring to FIG. 13, the display device 1000 includes a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light supplied from the light emitting module 1031 to provide surface light. The light guide plate 1041 may include transparent material. For instance, the light guide plate 1041 may include one of acryl-based resin, such as PMMA (polymethyl methacrylate), PET (polyethylene terephthalate), PC (polycarbonate), COC (cyclic olefin copolymer) and PEN (polyethylene naphthalate) resin.

The light emitting module 1031 is disposed at one side of the light guide plate 1041 to supply the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may include a substrate 1033 and light emitting device packages 30 according to the embodiments. The light emitting device packages 30 are arranged on the substrate 1033 while being spaced apart from each other at the predetermined interval. The substrate 1033 may include a printed circuit board (PCB), but the embodiment is not limited thereto. In addition, the substrate 1033 may also include a metal core PCB (MCPCB) or a flexible PCB (FPCB), but the embodiment is not limited thereto. If the light emitting device packages 30 are installed on the side of the bottom cover 1011 or on a heat dissipation plate, the substrate 1033 may be omitted. The heat dissipation plate partially makes contact with the top surface of the bottom cover 1011. Thus, the heat generated from the light emitting device packages 30 can be emitted to the bottom cover 1011 through the heat dissipation plate.

In addition, the light emitting device packages 30 are arranged such that light exit surfaces of the light emitting device packages 30 are spaced apart from the guide plate 1041 by a predetermined distance, but the embodiment is not limited thereto. The light emitting device packages 30 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which travels downward through the bottom surface of the light guide plate 1041, toward the display panel 1061, thereby improving the brightness of the display panel 1061. For instance, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for instance, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by blocking the light generated from the light emitting module 1031 or allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmittive sheet. For instance, the optical sheet 1051 includes at least one of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be provided on the display panel 1061, but the embodiment is not limited thereto.

The light guide plate 1041 and the optical sheet 1051 can be provided in the light path of the light emitting module 1031 as optical members, but the embodiment is not limited thereto.

FIG. 14 is a sectional view showing a display device according to the embodiment.

Referring to FIG. 14, the display device 1100 includes a bottom cover 1152, a substrate 1120 on which the light emitting device packages 30 are arranged, an optical member 1154, and a display panel 1155.

The substrate 1120 and the light emitting device packages 30 may constitute the light emitting module 1060. In addition, the bottom cover 1152, at least one light emitting module 1060, and the optical member 1154 may constitute the light unit (not shown).

The bottom cover 1151 can be provided with a receiving section 1153, but the embodiment is not limited thereto.

The optical member 1154 may include at least one of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto the display panel 1155, and the brightness enhanced sheet improves the brightness by reusing the lost light.

The optical member 1154 is disposed above the light emitting module 1060 in order to convert the light emitted from the light emitting module 1060 into the surface light. In addition, the optical member 1154 may diffuse or collect the light.

FIG. 15 is a perspective view showing a lighting device according to the embodiment.

Referring to FIG. 15, the lighting device 1500 includes a case 1510, a light emitting module 1530 installed in the case 1510, and a connection terminal 1520 installed in the case 1510 to receive power from an external power source.

Preferably, the case 1510 includes material having superior heat dissipation property. For instance, the case 1510 includes metallic material or resin material.

The light emitting module 1530 may include a substrate 1532 and light emitting device packages 30 installed on the substrate 1532. The light emitting device packages 30 are spaced apart from each other or arranged in the form of a matrix.

The substrate 1532 includes an insulating member printed with a circuit pattern. For instance, the substrate 1532 includes a PCB, an MCPCB, an FPCB, a ceramic PCB, and an FR-4 substrate.

In addition, the substrate 1532 may include material that effectively reflects the light. A coating layer can be formed on the surface of the substrate 1532. At this time, the coating layer has a white color or a silver color to effectively reflect the light.

At least one light emitting device package 30 is installed on the substrate 1532. Each light emitting device package 30 may include at least one LED (light emitting diode) chip. The LED chip may include an LED that emits the light of visible ray band having red, green, blue or white color and a UV (ultraviolet) LED that emits UV light.

The light emitting device packages 30 of the light emitting module 1530 can be variously arranged to provide various colors and brightness. For instance, the white LED, the red LED and the green LED can be arranged to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 can be prepared in the form of a pin inserted into the external power source or connected to the external power source through a wire.

According to the embodiment, the light emitting device includes at least one buffer structure spaced apart from the light emitting structure, thereby preventing the light emitting structure from being damaged (e.g., cracked) due to the impact applied in the LLO process.

According to the embodiment, the buffer structures may be separated from each other or integrated with each other while being spaced apart from each edge region or each lateral surface of the light emitting structure. The integration has been described above. As described above, the buffer structures are sufficiently ensured, so that the cracks of the light emitting structure can be prevented. Accordingly, the reliability for the light emitting structure can be improved.

According to the embodiment, the buffer structure and the light emitting structure have a stack structure of the same layers, so that the manufacturing process can be easily performed.

According to the embodiment, the first protective layer is provided on a lateral surface of the compound semiconductor layer, so that the compound semiconductor layers can be prevented from electrically shorted with the conductive support member.

According to the embodiment, the first and second adhesive layers are formed between the conductive support member and the compound semiconductor layers, so that adhesive performance between the compound semiconductor layer and the conductive support member can be maximized.

According to the embodiment, the reflective layer is provided on the first and second adhesive layers, so that light emitted from the compound semiconductor layers is reflected upward, thereby improving light emission efficiency.

According to the embodiment, the light emitting device is provided at a region corresponding to about ½ of the width of the isolation region, thereby preventing the light emitting structure from being damaged (e.g., cracked) due to the impact applied in the LLO process.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a conductive support member;
a chip region on the conductive support member;
a light emitting structure on the chip region;
an isolation region on the conductive support member and surrounding the chip region;
at least one buffer structure on the isolation region;
a first protective layer on lateral surfaces of the light emitting structure;
a second protective layer on at least one lateral surface of the buffer structure; and
an insulating layer on the conductive support member between the light emitting structure and the buffer structure,
wherein the light emitting structure and the buffer structure include a first conductive semiconductor layer, an active layer, and a second conductive semiconductor layer.

2. The light emitting device of claim 1, wherein the buffer structures are spaced apart from edge regions of the light emitting structure and are separated from each other.

3. The light emitting device of claim 2, wherein the buffer structure has a top surface formed in one of a cross shape, a circular shape, a diamond shape, a sector shape, a hemicircular shape, a polygonal shape, or a ring shape.

4. The light emitting device of claim 1, wherein the buffer structure are spaced apart from edges region and lateral surfaces of the light emitting structure and are formed in a line along the lateral surfaces of the light emitting structure.

5. The light emitting device of claim 1, wherein a distance between the light emitting structure and the buffer structure is in a range of about 5 μm to about 50 μm.

6. The light emitting device of claim 1, wherein the buffer structure has a width in a range of about 5 μm to about 30 μm.

7. The light emitting device of claim 1, wherein the light emitting structure and the buffer structure further include:
a first adhesive layer on the conductive support member;
a second adhesive layer on the first adhesive layer;

a reflective layer on the second adhesive layer; and a diffusion barrier layer on lateral surfaces of the second adhesive layer and the reflective layer.

8. The light emitting device of claim 1, further comprising an electrode on the light emitting structure, wherein power is supplied by the electrode and the conductive support member.

9. The light emitting device of claim 1, wherein the buffer structure is positioned at a region corresponding to about ½ of a width of the isolation region.

10. The light emitting device of claim 9, wherein the width of the isolation region is in a range of about 5 µm to about 100 µm.

11. The light emitting device of claim 1, wherein buffer structures are spaced apart from an edge region and a lateral surface of the light emitting structure.

12. The light emitting device of claim 1, wherein the buffer structure includes a zener device.

13. The light emitting device of claim 12, wherein the zener device includes:
   a first zener electrode electrically connecting the first conductive semiconductor layer of the buffer structure to the second conductive semiconductor layer of the light emitting structure; and
   a second zener electrode electrically connecting the second conductive semiconductor layer of the buffer layer to the conductive support member.

14. The light emitting device of claim 13, wherein the first zener electrode is provided on both the first protective layer and the insulating layer.

15. The light emitting device of claim 13, wherein the second zener electrode is provided on the second protective layer.

16. A light emitting device comprising:
   a conductive support member;
   a light emitting structure on the conductive support member;
   at least one buffer structure on the conductive support member and surrounding the light emitting structure;
   a first protective layer on lateral surfaces of the light emitting structure;
   a second protective layer on at least one lateral surface of the buffer structure; and
   a reflective layer between the light emitting structure and the conductive support member,
   wherein a portion of the first protective layer is disposed between the reflective layer and the light emitting structure.

17. The light emitting device of claim 16, wherein the buffer structures are spaced apart from edge regions of the light emitting structure and are separated from each other.

18. The light emitting device of claim 16, wherein the buffer structures are spaced apart from edges region and lateral surfaces of the light emitting structure and are formed in a line along the lateral surfaces of the light emitting structure.

19. A light emitting device comprising:
   a support member;
   an adhesive layer on the support member;
   a light emitting structure on the adhesive layer;
   at least one buffer structure on the adhesive layer and spaced apart from the light emitting structure;
   an insulating layer between the light emitting structure and the buffer structure; and
   a reflective layer under the light emitting device and the buffer structure,
   wherein the insulating layer contacts the reflective layer.

20. The light emitting device of claim 19, wherein the insulating layer contacts a top surface of the adhesive layer.

* * * * *